United States Patent
Chen

(10) Patent No.: US 11,163,008 B2
(45) Date of Patent: Nov. 2, 2021

(54) TERMINAL DEVICE AND METHOD AND SYSTEM FOR MONITORING BATTERY SAFETY OF TERMINAL DEVICE

(71) Applicant: GUANGDONG OPPO MOBILE TELECOMMUNICATIONS CORP., LTD., Guangdong (CN)

(72) Inventor: Wei Chen, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 244 days.

(21) Appl. No.: 16/355,107

(22) Filed: Mar. 15, 2019

(65) Prior Publication Data
US 2019/0212394 A1    Jul. 11, 2019

Related U.S. Application Data

(63) Continuation of application No. PCT/CN2017/099133, filed on Aug. 25, 2017.

(51) Int. Cl.
*G01R 31/3835* (2019.01)
*H01M 10/48* (2006.01)
(Continued)

(52) U.S. Cl.
CPC ... *G01R 31/3835* (2019.01); *G01R 19/16542* (2013.01); *G01R 31/371* (2019.01);
(Continued)

(58) Field of Classification Search
None
See application file for complete search history.

(56) References Cited

U.S. PATENT DOCUMENTS

| 8,179,139 B2 * | 5/2012 | Kawasumi | ............ | H01M 10/42 324/430 |
| 2012/0081076 A1 | 4/2012 | Fujimura et al. | | |
| 2013/0009782 A1 | 1/2013 | Brandt et al. | | |

FOREIGN PATENT DOCUMENTS

| CN | 101460859 A | 6/2009 |
| CN | 101604849 A | 12/2009 |

(Continued)

OTHER PUBLICATIONS

Dongxu Ouyang, A Review on the Thermal Hazards of the Lithium-Ion Battery and the Corresponding Countermeasures, Jun. 18, 2019, 45 pages (Year: 2019).*

(Continued)

*Primary Examiner* — Tung S Lau
(74) *Attorney, Agent, or Firm* — Young Basile Hanlon & MacFarlane, P.C.

(57) ABSTRACT

A terminal device, a method for monitoring battery safety of a terminal device, and a system for monitoring battery safety of a terminal device are provided. The method for monitoring battery safety includes the following steps. A voltage of a battery of the terminal device is acquired in real time, and temperature of each area of a battery surface of the battery is acquired in real time, where the battery surface is divided into multiple areas. Whether a sudden change in voltage has occurred to the battery is determined according to the voltage of the battery acquired in real time, and whether the battery surface has an abnormal temperature area is determined according to the temperature of each area. Upon determining that the sudden change in voltage has occurred to the battery and the battery surface has the abnormal temperature area, the battery is determined to be currently abnormal.

14 Claims, 5 Drawing Sheets

(51) Int. Cl.

| | | |
|---|---|---|
| *G01R 31/371* | (2019.01) | |
| *G01R 19/165* | (2006.01) | |
| *G01R 31/382* | (2019.01) | |
| *H04M 1/72463* | (2021.01) | |

(52) U.S. Cl.
CPC ........ *G01R 31/382* (2019.01); *H01M 10/486* (2013.01); *H04M 1/72463* (2021.01)

(56) References Cited

FOREIGN PATENT DOCUMENTS

| | | | | |
|---|---|---|---|---|
| CN | 101752844 | A | 6/2010 | |
| CN | 101790691 | A | 7/2010 | |
| CN | 201993448 | U | 9/2011 | |
| CN | 102403551 | A | 4/2012 | |
| CN | 102565715 | A | 7/2012 | |
| CN | 102738525 | A | 10/2012 | |
| CN | 202651843 | U | 1/2013 | |
| CN | 203014355 | U | 6/2013 | |
| CN | 203722267 | * | 7/2014 | ................ H02J 7/00 |
| CN | 103969585 | A | 8/2014 | |
| CN | 105335669 | * | 2/2016 | ......... G06F 21/6218 |
| CN | 105373117 | A | 3/2016 | |
| CN | 105518927 | A | 4/2016 | |
| CN | 105548905 | A | 5/2016 | |
| CN | 105842554 | A | 8/2016 | |
| CN | 106708698 | A | 5/2017 | |
| CN | 106816658 | A | 6/2017 | |
| CN | 106901700 | * | 6/2017 | ................ H04B 7/15 |
| CN | 108474822 | * | 8/2018 | ........... G01R 31/371 |
| CN | 108562855 | A * | 9/2018 | ............ G01R 31/36 |
| DE | 10210516 | A1 | 10/2003 | |
| EP | 1798100 | A2 | 6/2007 | |
| GB | 2539187 | A | 12/2016 | |
| JP | H11133122 | A | 5/1999 | |
| JP | 2003009405 | A | 1/2003 | |
| JP | 2003009408 | A | 1/2003 | |
| JP | 2003114243 | A | 4/2003 | |
| JP | 2004031192 | A | 1/2004 | |
| JP | 2011015522 | A | 1/2011 | |
| JP | 2012052857 | A | 3/2012 | |
| JP | 2012074328 | A | 4/2012 | |
| JP | 2014022282 | A | 2/2014 | |
| JP | 2015035299 | A | 2/2015 | |
| JP | 2015115232 | A | 6/2015 | |
| JP | 2020520065 | * | 2/2019 | ............ H01M 10/42 |
| JP | 2020523968 | A | 8/2020 | |
| JP | 2020524474 | A | 8/2020 | |
| KR | 20090006919 | A | 1/2009 | |
| KR | 2020-0040272 | A * | 2/2020 | ........... G01R 31/392 |

OTHER PUBLICATIONS

Guangxu Zhang, Internal short circuit mechanisms, experimental approaches and detection methods of lithium-ion batteries for electric vehicles: A review, Feb. 8, 2021, 22 pages (Year: 2021).*
Zhendong Zhang, Real-time diagnosis of micro-short circuit for Li-ion batteries utilizing low-pass filters, Oct. 29, 2018, 12 pages (Year: 2018).*
The second OA with English translation issued in corresponding CN application No. 201780003742.1 dated Aug. 24, 2020.
Communication pursuant to Article 94(3)EPC issued in corresponding European application No. 17922549.5 dated Oct. 26, 2020.
English translation of International search report issued in corresponding international application No. PCT/CN2017/099133 dated Mar. 27, 2018.
English translation of Office Action 1 issued in corresponding Chinese application No. 201780003742.1 dated Feb. 25, 2020.
Examination Report issued in corresponding European Application No. 17922549.5 dated May 18, 2020.
English translation of Office Action 1 issued in corresponding Indian application No. 201917020079 dated Jun. 17, 2020.
Decision for rejection with English Translation issued in corresponding CN application No. 2017800037421 dated Dec. 3, 2020.
Notice of reasons for refusal with English Translation issued in corresponding JP application No. 2019562387 dated Dec. 8, 2020.
OA issued with English Translation in corresponding KR application No. 10-2019-7033404 dated Jan. 22, 2021.
Extended European search report issued in corresponding European application No. 17922549.5 dated Sep. 6, 2019.
Nail penetration test for lithium iron phosphate power Li-ion battery. Jin Biao etc. Feb. 2017.
First office action issued in corresponding Chinese application No. 201780003742.1 dated Feb. 25, 2020.
Yoshioka et al., A Deterioration Diagnosis Method for Li-ion Battery Using a Transient Characteristic and Development of an Automatic Diagnosis Circuit, dated 2015. (6 pages).
Chinese Notification to Grant Patent Right for Invention with English Translation for CN Application 201780003742.1 dated May 27, 2021. (7 pages).
Japanese Office Action with English Translation for JP Application 2019-562387 dated Jul. 13, 2021. (8 pages).
Korean Second Final Rejection with English Translation issued in corresponding KR application No. 20197033404 dated Sep. 16, 2021.

\* cited by examiner

TERMINAL DEVICE AND METHOD AND SYSTEM FOR MONITORING BATTERY SAFETY OF TERMINAL DEVICE

CROSS-REFERENCE TO RELATED APPLICATION(S)

This application is a continuation of International Application No. PCT/CN2017/099133, filed on Aug. 25, 2017, the disclosure of which is hereby incorporated by reference in its entirety.

TECHNICAL FIELD

This disclosure relates to the technical field of terminal devices, and more particularly to a method for monitoring battery safety of a terminal device, a system for monitoring battery safety of a terminal device, and a terminal device with the system for monitoring battery safety.

BACKGROUND

A battery is a source of power for a terminal device such as a mobile phone and provides long-term steady power supply for the terminal device. The battery that was first used for the terminal device is a Nickel chromium battery or a Nickel-metal hydride (Ni-MH) battery. However, as a screen of the terminal device is getting larger, the terminal device is getting more powerful, etc., capacities of the Nickel chromium battery and the Ni-MH battery are already unable to satisfy requirements on power. Instead, a Lithium-ion battery has a great number of advantages. For example, due to its high energy density, the Lithium-ion battery can be made lighter and of higher capacity, charges and discharges faster, and has no memory effect compared with the Nickel chromium battery and the Ni-MH battery. In addition, the Lithium-ion battery causes the least harm to elements in the environment. Therefore, the Lithium-ion battery has gradually replaced the conventional Nickel chromium battery and the conventional Ni-MH battery.

Although the Lithium-ion battery has effectively solved the problem of battery capacity, a problem of safety still exists. For example, when the Lithium-ion battery is damaged and thus leads to a short circuit, heat is produced inside a cell. When the heat is produced too fast, the battery will probably burst into fire and explosion. Therefore, safety monitor needs to be conducted on the battery to avoid accidents.

SUMMARY

According to a first aspect of the present disclosure, a method for monitoring battery safety of a terminal device provided includes the following. A voltage of a battery of the terminal device is acquired in real time, and temperature of each area of a battery surface of the battery is acquired in real time, where the battery surface is divided into multiple areas. Whether a sudden change in voltage has occurred to the battery is determined according to the voltage of the battery acquired in real time, and whether the battery surface has an abnormal temperature area is determined according to the temperature of each area. Upon determining that the sudden change in voltage has occurred to the battery and the battery surface has the abnormal temperature area, the battery is determined to be currently abnormal.

According to a second aspect of the present disclosure, a system for monitoring battery safety of a terminal device is provided. The system for monitoring battery safety of a terminal device includes a differential amplifying circuit, a temperature sensing sensor, and a controller. The differential amplifying circuit is configured to acquire in real time a voltage of a battery of the terminal device. The temperature sensing sensor is configured to acquire in real time temperature of each area of a battery surface of the battery, where the battery surface is divided into multiple areas. The controller is configured to determine whether a sudden change in voltage has occurred to the battery according to the voltage of the battery acquired in real time, determine whether the battery surface has an abnormal temperature area according to the temperature of each area, and determine that the battery is currently abnormal, upon determining, by the determining module, that the sudden change in voltage has occurred to the battery and the battery surface has the abnormal temperature area.

According to a third aspect of the present disclosure, a terminal device is provided. The terminal device includes a battery having a battery surface divided into a plurality of areas, a differential amplifying circuit, a temperature sensing sensor, and a controller. The temperature sensing sensor is configured to acquire in real time temperature of each area of the battery surface. The temperature sensing sensor is configured to acquire in real time temperature of each area of the battery surface. The controller is configured to a temperature sensing sensor, configured to acquire in real time temperature of each area of the battery surface, determine whether the battery surface has an abnormal temperature area according to the temperature of each area, and determine that the battery is currently abnormal, upon determining that the sudden change in voltage has occurred to the battery and the battery surface has the abnormal.

DETAILED DESCRIPTION

Figure 1:
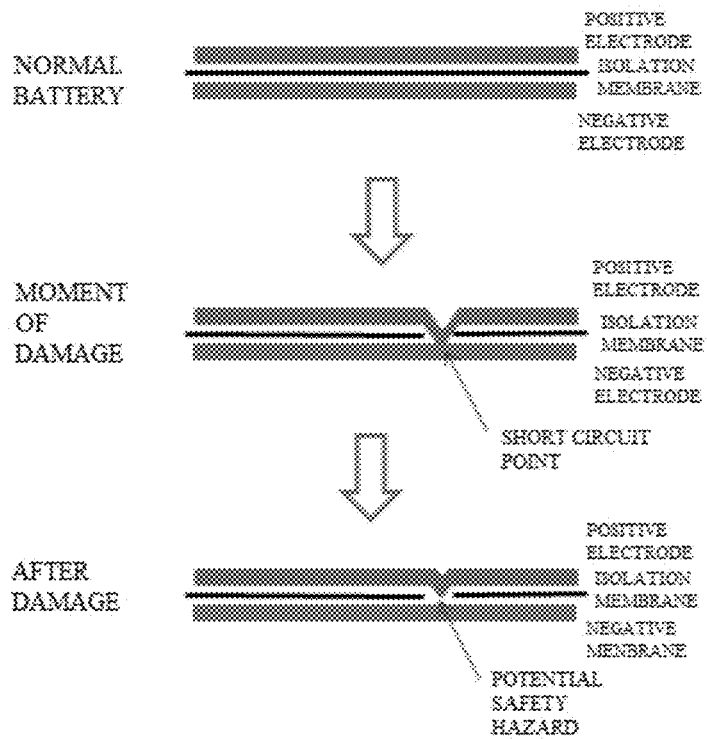
FIG. 1 is a schematic diagram illustrating a battery damage process according to an implementation of the present disclosure.

Implementations of the present disclosure will be further described below with reference to the accompanying drawings, where the same or similar reference numerals denote the same or similar elements or elements with the same or similar functions. It will be appreciated that the implementations described hereinafter with reference to the accompanying drawings are illustrative and for the purpose of explanation rather than restriction of the disclosure.

Before the method for monitoring battery safety of a terminal device, the system for monitoring battery safety of a terminal device, and the terminal device with the system for monitoring battery safety of implementations of the present disclosure are described, a structure of a battery used for terminal devices and potential safety hazard of the battery will be first described below.

For instance, a Lithium-ion battery mainly includes a cell and a battery protection system. The cell is known as the "heart" of the Lithium-ion battery and includes anode materials and cathode materials, electrolyte, an isolation membrane, and a housing, and outside the cell is the battery protection system. The anode materials of the cell are Lithium molecular materials such as Lithium Manganate, Lithium Cobaltate, and the like. The anode materials determine energy of the battery. The cathode material is graphite. The isolation membrane is disposed between the anode and the cathode of the battery. To make it easier to understand, the isolation membrane is like a piece of paper which is continuously folded within a small battery case and filled with the anode and cathode materials and the electrolyte. In a charging process, Lithium molecules in the anode material are activated and driven, under the action of an external electric field, to the cathode to be stored in gaps of a graphic electrode structure. Driving more Lithium molecules results in more energy stored. In a discharging process, Lithium ions in the cathode are driven to the anode and become initial Lithium molecules in the anode. The above steps are repeated to achieve charging and discharging of the battery.

The isolation membrane is mainly configured to isolate completely the anode materials from the cathode materials of the cell. Once the anode materials and the cathode materials are in direct contact, a short circuit will occur inside the battery, thereby leading to some potential safety hazard. Therefore, the isolation membrane cannot be too thin since a thin isolation membrane tends to be damaged. However, with more requirements on the terminal device of users, such as a lighter and thinner terminal device, a larger screen, and longer battery life, manufacturers start to look for a battery with higher energy density. For example, increase energy density of the battery by filling in more anode materials and more cathode materials. Nevertheless, for the same volume, more anode materials and cathode materials filled in result in thinner isolation membrane. Since the isolation membrane tends to be damaged when the battery has been subject to damage such as an external impact, the short circuit will probably occur.

As an implementation, when the battery is subject to an external mechanical damage such as squeezing, dropping, and piercing, due to thin isolation membrane, a short circuit between the anode and the cathode (that is, an internal short-circuit within the battery) tends to occur due to damage of isolation membrane. At the moment of the short circuit, a voltage of the battery will be instantly decreased due to a local internal short-circuit point formed inside the battery. A higher degree to which the battery is damaged leads to more serious voltage decrease. At the same time, heating at a short-circuit point is serious, which results in substantially higher temperature at the short-circuit point than at other areas of the battery.

In general, as to a particularly serious damage, an area of the internal short-circuit of the battery is large, and heating will continuously occur at a point of damage until the voltage of the battery decreases to 0V (volt). If the voltage of the battery is high, the battery will even burst into fire and burn. As to a minor damage, the area of the internal short-circuit of the battery is small, and a short-circuit current is formed at the short-circuit point. Since the short-circuit current is large, a large quantity of heat is produced at the short-circuit point and temperature thereat gets higher, which will in turn fuse the short-circuit point. Therefore, the voltage of the battery will return to an initial state. In this case, the battery may still be used as usual like a normal battery. However, potential safety hazard already exists in the battery, and the internal short-circuit may be triggered at any time when the battery is in use subsequently. As illustrated in FIG. 1, when the battery is subject to an external mechanical damage, only a minor damage will occur mostly. The internal short-circuit caused as such lasts only a short time, and the battery will soon return to the initial state. However, the isolation membrane is partially damaged at this time. Therefore, such battery abnormality is generally difficult to monitor, while the battery abnormality as such will bring about some potential safety hazard to the terminal device.

As another implementation, in a charging and discharging process of the battery, Lithium ion may accumulate in the anode and the cathode. When accumulation occurs, a type of dendrite, like crystal formed by many substances, is formed and can gradually become longer. In this process, the dendrite may also pierce the isolation membrane, thereby resulting in the internal short-circuit. The situation described in the above implementation, where the battery is restored to the initial state after a short-term internal short-circuit caused by the external mechanical damage, is even more serious in this implementation, that is, the internal short-circuit of the battery is easier to happen again.

Once there is short circuit, when the battery is in use, large quantities of heat will be produced inside the cell. The heat can result in vaporization of the electrolyte inside the cell. When the heat is produced too fast, the vaporization process will be very fast accordingly, which will cause increase in internal pressure of the cell. When the internal pressure reaches up to a certain extent to which the housing is unable to bear, the housing can crack, thereby resulting in explosion. When exposed to open fire, the battery can burst into fire.

In addition, besides increasingly thinner isolation membrane caused by increasing energy density, which results in damage of isolation membrane, thereby causing accidents, quick charging is also one of major factors of potential safety hazard of the battery.

Quick charging, as the name suggests, is a process of charging fast a rechargeable battery. For example, a charging process of the battery can include at least one of a trickle charging stage, a constant-current charging stage, and a constant-voltage charging stage. In the trickle charging stage, a current feedback loop can be utilized to make current flowing into the battery in the trickle charging stage satisfy expected charging current of the battery (such as a first charging current). Exemplarily, when voltage is lower than 3.0V, a 100 mA (milliampere) charging current is adopted to pre-charge the battery. In the constant-current charging stage, the current feedback loop can be utilized to make current flowing into the battery in the constant-current charging stage satisfy expected charging current of the battery (such as a second charging current, which may be larger than the first charging current). Exemplarily, the charging current can range from 0.1C (Coulomb) to several Coulombs for different batteries, where C represents battery capacity. Generally, in the constant-current charging stage, a 0.1C charging current is adopted for charging in a normal charging mode. However, in a quick charging mode, a charging current larger than 0.1C is adopted for charging in the constant-current charging stage to complete charging within a short time period. In the constant-voltage charging stage, a voltage feedback loop can be utilized to make voltage applied to the battery in the constant-voltage charging stage satisfy expected charging voltage of the battery. Exemplarily, when the voltage of the battery is equal to 4.2V, proceed to the constant-voltage charging stage, in which charging voltage is constantly 4.2V. When the battery is gradually fully charged, the charging current can be decreased. When the charging current is smaller than 100 mA, it can be determined that the battery is fully charged.

In the constant-current charging stage, since the charging current is large (such as 0.2C~0.8C, or even up to 1C) and the charging process of the battery is an electrochemical reaction process, heat is certainly produced in this process. In addition, larger charging current leads to larger quantities of heat produced within a short time period. When the isolation membrane has been damaged, the short circuit between the anode and cathode will be easily triggered. Once short circuit occurs, more heat tends to be produced, and vaporization of the electrolyte occurs, which can cause increase in internal pressure of the cell. When the internal pressure reaches up to a certain extent to which the housing is unable to bear, the housing can crack, thereby resulting in explosion. When in contact with open fire, the battery can burst into fire.

In other words, once there is internal short-circuit in the battery, the battery is abnormal and thus some potential safety hazard exists, which may result in accidents when the battery is in use.

Inventors of the present disclosure, based on continuous research and experiments on batteries, have found that when the battery is used in a normal state, the voltage of the battery is relatively steady, and temperatures of each area of a battery surface of the battery are relatively balanced. However, when the battery is damaged, due to probability of the internal short-circuit of the battery, there will be a sudden drop (that is, decrease) in the voltage of the battery in this case, and a short-circuit current is formed at the short-circuit point. Since the short-circuit current is large, a large amount of heat will be produced at the short-circuit point, and temperature at the short-circuit point will get higher, thereby making temperature substantially higher at the short-circuit point than at other areas of the battery and causing abnormal temperature at an area corresponding to the short-circuit point. Inventors have verified the existence of a sudden change in voltage and an abnormal temperature area through a great number of experiments. Therefore, according to test results, once the battery has been damaged, a signal representing a sudden change in voltage will exist, so will the abnormal temperature area.

Based on the above findings and a great number of experimental tests, in order to monitor effectively whether the battery has been damaged to avoid potential safety hazard of the battery, thereby avoiding accidents, the present disclosure provides an effective method for monitoring safety to detect whether the battery is abnormal.

The following will describe the method for monitoring battery safety of a terminal device, the system for monitoring battery safety of a terminal device, and the terminal device according to implementations of the present disclosure with reference to the accompanying drawings.

It should be noted that, in implementations of the present disclosure, the "terminal device" can include but is not limited to a device configured via a wired line and/or a wireless interface to receive/transmit communication signals. Examples of the wired line may include, but are not limited to, at least one of a public switched telephone network (PSTN), a digital subscriber line (DSL), a digital cable, a direct connection cable, and/or another data connection line or network connection line. Examples of the wireless interface may include, but are not limited to, a wireless interface with a cellular network, a wireless local area network (WLAN), a digital television network (such as a digital video broadcasting-handheld (DVB-H) network), a satellite network, an AM-FM broadcast transmitter, and/or with another communication terminal. A communication terminal configured to communicate via a wireless interface may be called a "wireless communication terminal", a "wireless terminal", and/or a "mobile terminal". Examples of a mobile terminal may include, but are not limited to, a satellite or cellular telephone, a personal communication system (PCS) terminal capable of cellular radio telephone, data processing, fax, and/or data communication, a personal digital assistant (PDA) equipped with radio telephone, pager, Internet/Intranet access, web browsing, notebook, calendar, and/or global positioning system (GPS) receiver, and/or other electronic devices equipped with radio telephone capability such as a conventional laptop or a handheld receiver.

Figure 2:
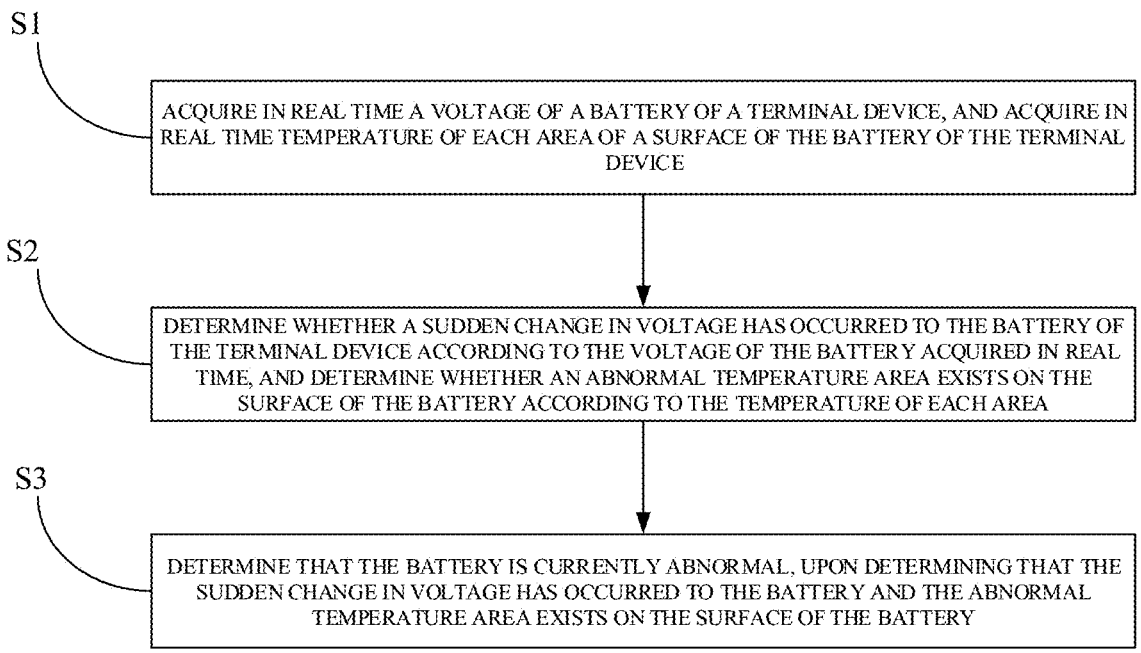
FIG. 2 is a flowchart illustrating a method for monitoring battery safety of a terminal device according to an implementation of the present disclosure.

FIG. 2 is a flowchart illustrating a method for monitoring battery safety of a terminal device according to implementations of the present disclosure. As illustrated in FIG. 2, the method for monitoring battery safety of a terminal device can include the following.

At S1, acquire in real time a voltage of a battery of the terminal device, and acquire in real time temperature of each area of a battery surface of the battery. The battery surface is divided into multiple areas.

In an implementation, temperature detection technologies such as those conducted with a heat resistor or a thermocouple can be adopted to detect the temperature of each area of the battery surface. Adopting the heat resistor or thermocouple related temperature detection technology makes it easier to achieve integration, thereby making it convenient to achieve temperature detection in a small device or a portable device.

Specifically, the battery surface can be divided into multiple areas, each area is provided with a temperature sensing probe, and temperature of the each area is detected in real time through the temperature sensing probe. That is to say, in an implementation, the temperature of each area is acquired through a temperature sensing probe disposed corresponding to the each area.

Figure 3:
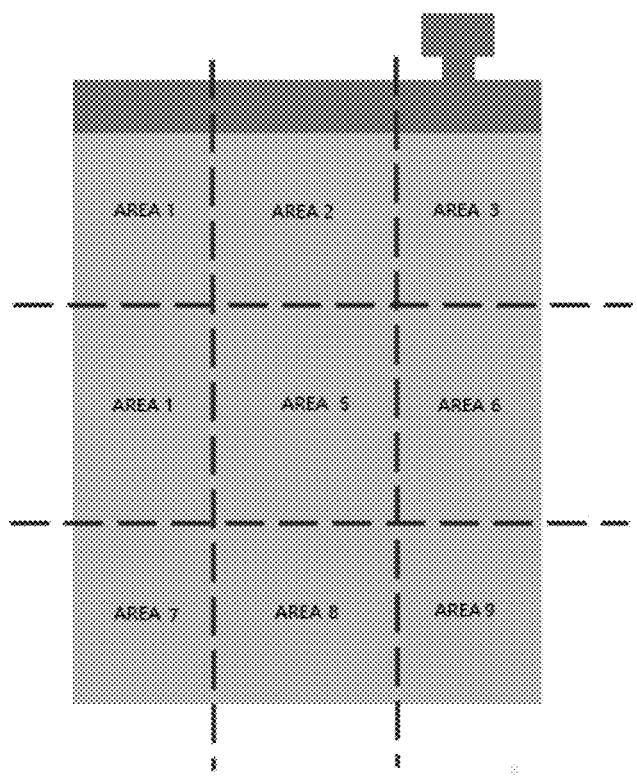
FIG. 3 is a schematic diagram illustrating a division of areas of a battery surface according to an implementation of the present disclosure.

In an implementation, as illustrated in FIG. 3, the multiple areas are arranged in array. For example, Area 1 to Area 9 are in a 3*3 array.

Figure 4:
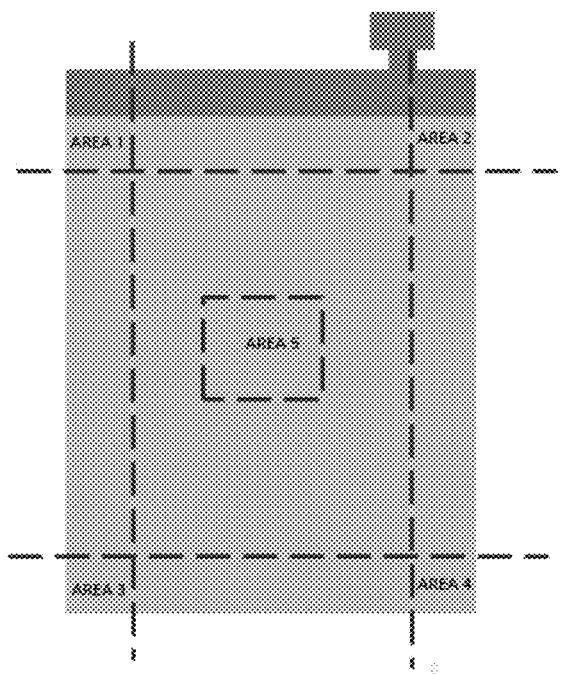
FIG. 4 is a schematic diagram illustrating a division of areas of a battery surface according to another implementation of the present disclosure.

In another implementation, in order to reduce complexity of a temperature detecting scheme, the temperature sensing probe can also be disposed only in areas of the battery that are easy to be damaged, such as a corner area of the battery, a head area of the battery, and a tail area of the battery, as illustrated in FIG. 4. In other words, the multiple areas can include a corner area of the battery, a head area of the battery, and a tail area of the battery.

At S2, determine whether a sudden change in voltage has occurred to the battery according to the voltage of the battery acquired in real time, and determine whether the battery surface has an abnormal temperature area according to the temperature of each area.

Figure 5:
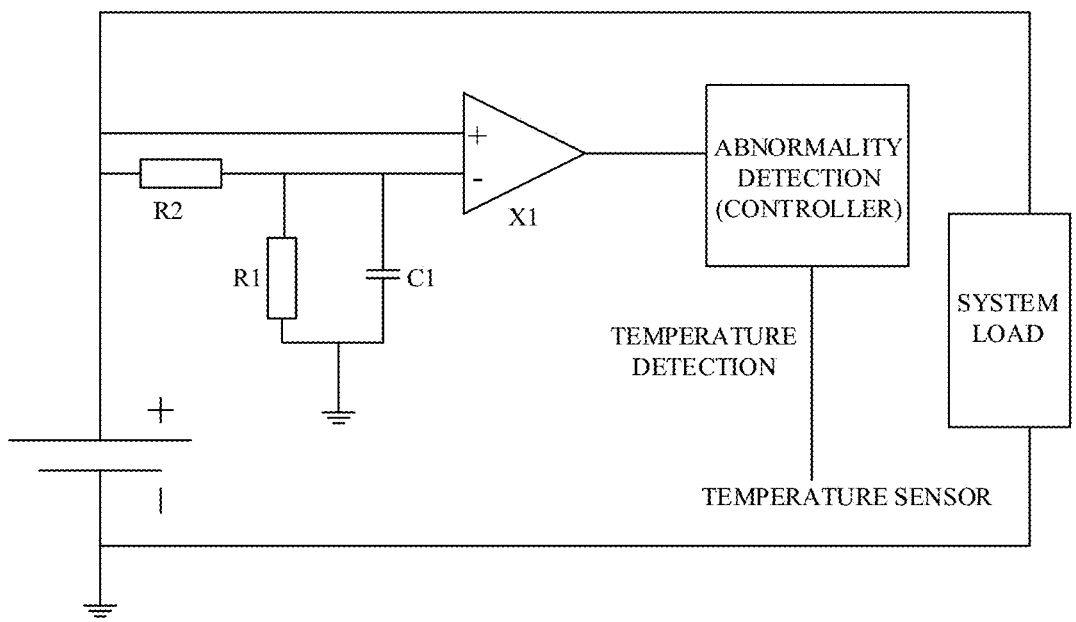
FIG. 5 is a schematic diagram illustrating a voltage-sudden-change detecting circuit according to an implementation of the present disclosure.

In an implementation, a differential amplifying circuit can be built to detect in real time the voltage of the battery. As an implementation, the differential amplifying circuit, as illustrated in FIG. 5, can include a resistor R1, a resistor R2, a capacitor C1, and a differential amplifier X1. The resistor R2 has one end coupled with a positive electrode of the battery and the other end coupled with a negative input end of the differential amplifier. The resistor R1 and the capacitor C1 form an RC voltage-stabilizing and filtering circuit. The resistor R1 has one end coupled with the negative input end of the differential amplifier X1 and the other end grounded. The capacitor C1 is coupled in parallel with the resistor R1. The differential amplifier X1 has a positive input end also coupled with the positive electrode of the battery. Real-time detection of the voltage of the battery can be achieved through the differential amplifying circuit, and whether a sudden change has occurred to the voltage of the battery can be determined according to a signal output by the differential amplifying circuit.

It can be understood that, the negative input end of the differential amplifier X1 is grounded via the capacitor C1. When the sudden change in voltage has occurred to the battery, due to the capacitor, a voltage of the negative input end of the differential amplifier X1 will remain unchanged within a certain time period, while a voltage of the positive input end of the differential amplifier X1 will suddenly change directly, and output of the differential amplifier X1 will be inverted, therefore, it is possible to determine whether the sudden change in voltage has occurred to the battery by monitoring an output signal of the differential amplifier X1.

It should be noted that, in other implementations of the present disclosure, the voltage of the battery can also be detected in real time through other voltage detecting circuits, to achieve real-time detection of the voltage of the battery. The circuit for detecting the voltage of the battery can be implemented in various manners, which is known to those skilled in the art and will not be described in detail herein.

In one implementation, whether the battery surface has the abnormal temperature area can be determined by determining whether there is an area of which a temperature is higher than temperatures of other areas, or by determining whether there is an area of which a temperature is higher than a preset temperature threshold. For example, when an area is detected to have a temperature higher than temperatures of other areas, the area can be regarded as the abnormal temperature area, in other words, the battery surface has the abnormal temperature area.

By comparing the temperature of each area, interference of outside temperature with detection results can also be avoided, thereby improving detection accuracy.

At S3, determine that the battery is currently abnormal, upon determining that the sudden change in voltage has occurred to the battery and the battery surface has an abnormal temperature area.

In implementations of the disclosure, the inventor, through a quantity of tests and experiments, has found that when the battery is used normally, the voltage of the battery is relatively steady, and temperatures of the battery surface are relatively balanced. However, when the battery is subject to an external mechanical damage such as dropping, colliding, squeezing, piercing, and the like, there will be a sudden change in the voltage of the battery together with partially high temperature. Therefore, according to the method for monitoring battery safety of a terminal device provided herein, whether the battery is currently damaged is monitored by detecting whether the sudden change in voltage has occurred to the battery and detecting whether the battery surface has the abnormal temperature area. Once the sudden change in voltage is detected to have occurred to the battery and the battery surface is detected to have the abnormal temperature area, it indicates that the battery is currently damaged, the internal short-circuit has occurred, and the battery is determined to be currently abnormal with some potential safety hazard.

In one implementation, when the battery is in a no-load state or a light-load state, upon determining that the sudden change in voltage has occurred to the battery and the battery surface has the abnormal temperature area, the battery is determined to be currently abnormal.

The "no-load state" means that the battery is currently not discharged and there is no battery consumption current, for instance, the terminal device is in a power-off state. The "light-load state" means that present consumption current of the battery is very small, such as approximately 5 mA to 6 mA, for instance, the terminal device is in a screen-off state or in a light-system-load state.

When the battery is in the no-load state or in the light-load state, whether the sudden change in voltage has occurred to the battery and whether the battery surface has the abnormal temperature area are monitored, which can get rid off interference of an instant drop in voltage and an increase in temperature of the battery surface due to a sudden change in system load, thereby improving detection accuracy.

In one implementation, whether the sudden change in voltage has occurred to the battery can be determined according to the voltage of the battery acquired in real time as follows. Determine whether an instant drop in voltage has occurred to the battery according to the voltage of the battery acquired in real time. Determine that the sudden change in voltage has occurred to the battery when the instant drop in voltage has occurred to the battery.

When a magnitude of decrease in the voltage of the battery within a preset time period is greater than or equal to a preset threshold, determine that the instant drop in voltage has occurred to the battery.

Specifically, as an implementation, when the battery is in a no-load state or a light-load state, the preset threshold is greater than or equal to 10 mV, such as 150 mV to 400 mV.

Figure 6:
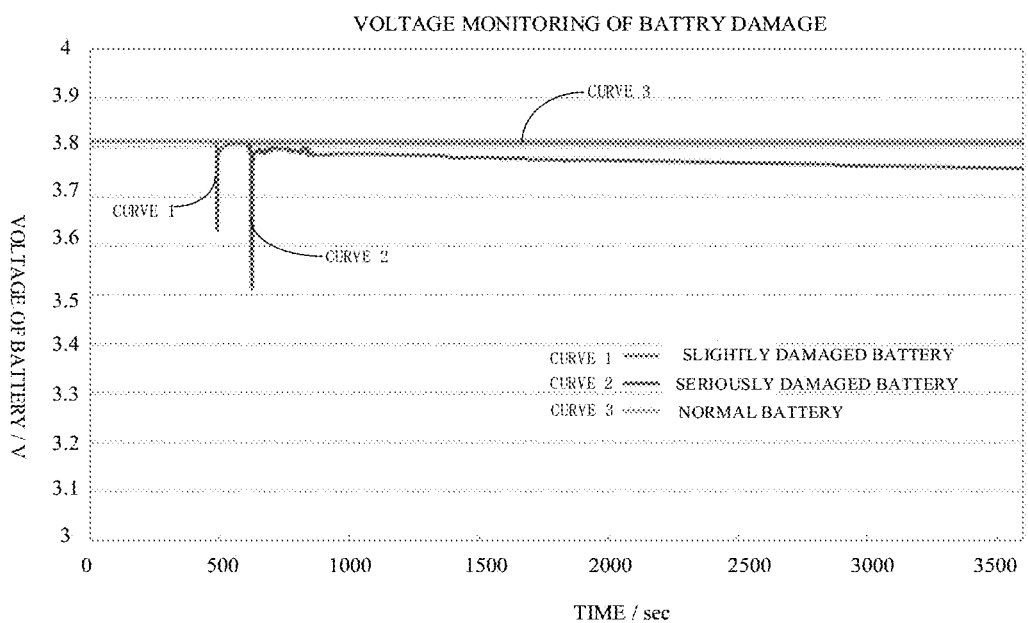
FIG. 6 is a schematic diagram illustrating a voltage monitoring curve of a damaged battery and a voltage monitoring curve of a normal battery according to an implementation of the present disclosure.

Specifically, in one implementation, voltage monitoring curves in a process in which the battery is subject to damage are illustrated in FIG. 6. Curve 1 is a voltage curve of a slightly damaged battery. Curve 2 is a voltage curve of a seriously damaged battery. Curve 3 a voltage curve of a normal battery that not damaged at all. According to Curve 1, when the battery is slightly damaged, the voltage of the battery changes suddenly from 3.8V to 3.63V in an instant and then is restored to about 3.8V. According to Curve 2, when the battery is seriously damaged, the voltage of the battery changes suddenly from 3.8V to 3.51V in an instant and then is restored to nearly 3.8V. According to Curve 3, for a normal battery, which is not damaged, the voltage of the battery remains nearly 3.8V. Therefore, by comparison of Curve 1, Curve 2, and Curve 3, once the battery is subject to an external mechanical damage such as dropping, colliding, squeezing, piercing, and the like, there will be a sudden change in the voltage of the battery, that is, the voltage will drop instantly. In addition, different degrees to which the battery is damaged result in different magnitudes of drops in the voltage.

Therefore, according to the method for monitoring battery safety of a terminal device provided herein, whether the battery is currently abnormal is determined by detecting whether the sudden change has occurred to the voltage the battery and detecting whether the battery surface has the abnormal temperature area. As such, real-time monitoring can be achieved upon battery damage, and prompt alert and repair can be made, which avoids potential safety hazard brought about by battery abnormality and improves considerably safety of the terminal device in use.

In one implementation, upon determining that the battery is currently abnormal, the battery is marked as abnormal, and when the terminal device is in a power-on state, the terminal device is controlled to send alert information indicative of battery abnormality.

Figure 7:
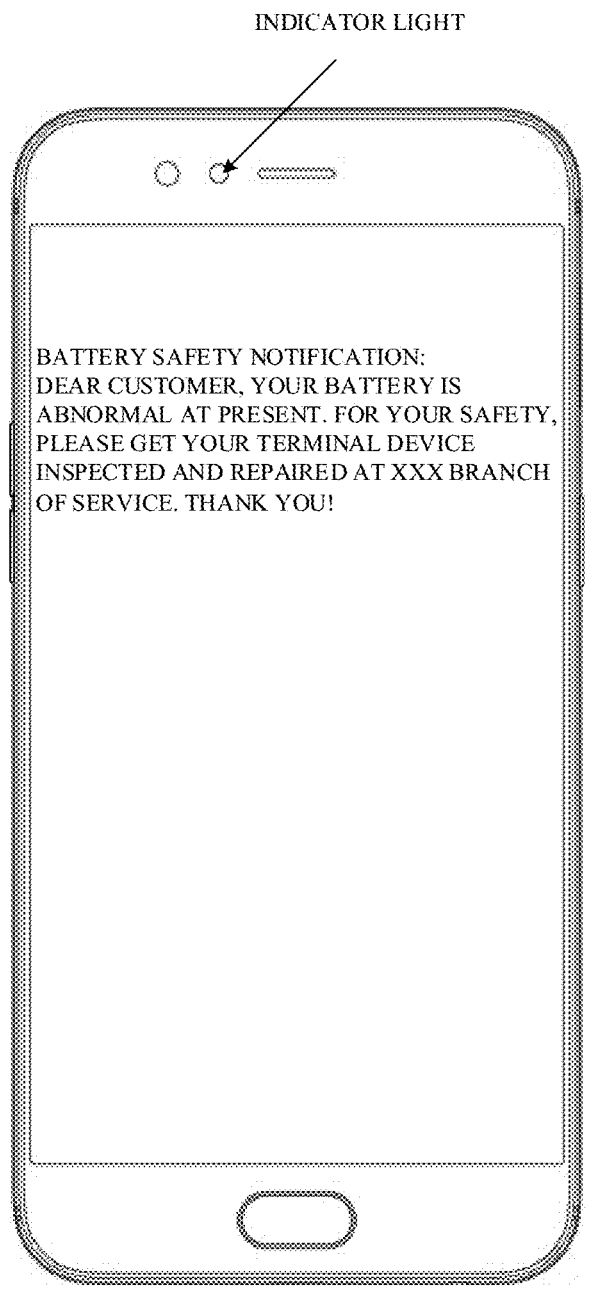
FIG. 7 is a schematic diagram illustrating alert information of a terminal device according to an implementation of the present disclosure.

For example, when the battery is detected to be currently abnormal, it is necessary to remind a user. As an implementation, as illustrated in FIG. 7, the user can be reminded by such alert information as "Battery safety notification: dear customer, your battery is abnormal due to damage at present. For your safety, please get your terminal device inspected and repaired at xxx branch of service. Thank you". As another implementation, when the user is reminded through the alert information illustrated in FIG. 7, the user can be further reminded by an indicator light flashing. For example, control the indicator light to flash in red light at a high frequency. As yet another implementation, the user can be further reminded through a speech function of the terminal device.

In general, when the user receives the above alert information, the user can promptly get the terminal device inspected and repaired. However, some users may fail to realize the seriousness of the problem when they receive the alert information. Therefore, they are likely to ignore the alert information and continue using the terminal device as usual. In this case, the user can be reminded multiple times. For example, the user can be reminded at least three times. When the user still does not deal with the problem after being reminded multiple times, some functions of the terminal device can be restricted.

In one implementation, when the battery is currently abnormal, a fault grade of the battery can be determined according to the sudden charge in voltage that has occurred to the battery and temperature information of the abnormal temperature area, and corresponding functions of the terminal device can be restricted according to the fault grade determined.

That is to say, the fault grade can be determined according to a magnitude of an instant drop in the voltage of the battery and the temperature information of the abnormal temperature area. For example, a greater magnitude of the instant drop in the voltage of the battery and a higher temperature of the abnormal temperature area indicate more serious battery damage. Accordingly, battery damage can include average damage, relatively serious damage, serious damage, and battery failure according to an extent to which the battery is damaged. Corresponding fault grades can be determined as an average grade, a relatively serious grade, a serious grade, and a complete fault grade. In turn, corresponding functions of the terminal device can be restricted according to the fault grade.

For instance, generally speaking, lower power consumption of applications of the terminal device leads to lower heating when the battery is in use. Exemplarily, only an instant messaging (IM) application is launched without a video chat. In this case, power consumption is low, heating of the battery is low, and thus risks of the battery are less likely to occur. However, when power consumption of an application(s) is high, such as watching a video, playing a mobile game, etc., power consumption of the battery is high and heating of the battery is high, which can easily cause accidents. Therefore, when the battery is determined to be abnormal, in case that the fault grade is the average grade, forbid use of applications of high power consumption such as video applications, game applications, etc.; in case that the fault grade is the relatively serious grade or the serious grade, forbid directly the entire system to be launched for fear of accidents, and alert information such as "there is potential safety hazard in the battery and the system is forbidden to be launched. Please get the terminal device inspected and repaired at xxx branch of service. Thank you for your cooperation" is displayed on the display screen of the terminal device to remind the user; in case that the fault grade is the complete fault grade, battery failure occurs and the system is powered off and unable to be launched.

In addition, since heating can also occur in a charging process of the battery, especially in a quick charging state where more heating occurs within a short time, when the battery is determined to be abnormal, quick charging of the battery is also forbidden. In a more serious situation, the user is even forbidden to charge the battery for fear of accidents, and alert information such as "due to battery damage, charging of the battery is forbidden. Please get the terminal device inspected and repaired at xxx branch of service. Thank you for your cooperation" is displayed on the display screen of the terminal device to remind the user.

To summarize, according to the method for monitoring battery safety of a terminal device according to implementations of the disclosure, the voltage of the battery and the temperature of each area of the battery surface are acquired in real time. Then whether the sudden change in voltage has occurred to the battery is determined according to the voltage of the battery acquired in real time, and whether the battery surface has the abnormal temperature area is determined according to the temperature of each area. Finally, on determining that the sudden change in voltage has occurred to the battery and the battery surface has the abnormal temperature area, determine that the battery is currently abnormal. In other words, when the battery is currently damaged, a sudden change will occur to the voltage of the battery, and meanwhile heating will occur in an area where an internal short circuit is caused by battery damage. In implementations of the disclosure, whether the battery is currently abnormal is determined by detecting whether the sudden change has occurred to the voltage the battery and whether the battery surface has the abnormal temperature area. In this way, real-time monitoring can be achieved upon battery damage, and prompt alert and repair can be made to avoid potential safety hazard caused by battery abnormality, which can substantially improve safety of the terminal device in use.

In addition, a non-transitory computer readable storage medium is provided in implementations of the disclosure. The non-transitory computer readable storage medium is configured to store computer programs which, when executed by a processor, are operable with the processor to execute the above method for monitoring battery safety.

According to the non-transitory computer readable storage medium provided herein, by executing the above method for monitoring battery safety, whether a battery is currently abnormal is determined by monitoring whether a sudden change in voltage has occurred to the battery and whether a battery surface has an abnormal temperature area. In this way, real-time monitoring can be achieved upon battery damage, and prompt alert and repair can be made to avoid potential safety hazard caused by battery abnormality, which can substantially improve safety of a terminal device in use.

Figure 8:
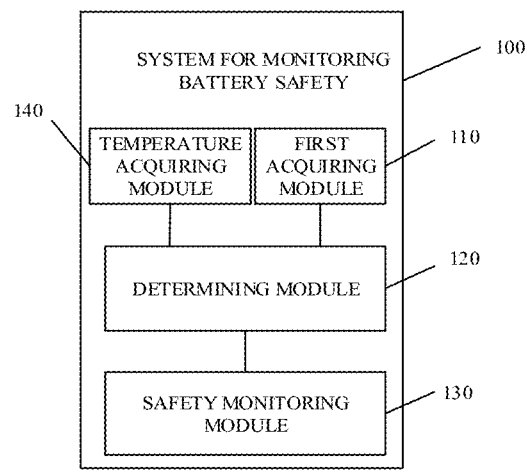
FIG. 8 is a schematic block diagram illustrating a system for monitoring battery safety of a terminal device according to an implementation of the present disclosure.

FIG. 8 is a schematic block diagram illustrating a system for monitoring battery safety of a terminal device according to an implementation of the present disclosure. As illustrated in FIG. 8, the system 100 for monitoring battery safety of a terminal device includes a first acquiring module 110, a temperature acquiring module 140, a determining module 120, and a safety monitoring module 130. The first acquiring module 110 can be implemented as a differential amplifying circuit, such as the one illustrated in FIG. 5, the a temperature acquiring module 140 can be implemented as a temperature sensor or temperature sensing probe or other similar components structured to acquire temperature, the determining module 120 and the safety monitoring module 130 can be implemented as or integrated into a controller.

The first acquiring module 110 is configured to acquire in real time a voltage of a battery of the terminal device. The temperature acquiring module 140 is configured to acquire in real time temperature of each area of a battery surface of the battery, where the battery surface is divided into multiple areas. The determining module 120 is configured to determine whether a sudden change in voltage has occurred to the battery according to the voltage of the battery acquired in real time, and determine whether the battery surface has an abnormal temperature area according to the temperature of each area. The safety monitoring module 130 is configured to determine that the battery is currently abnormal, upon determining, by the determining unit 120, that the sudden change in voltage has occurred to the battery and the battery surface has the abnormal temperature area.

In an implementation, temperature detection technology such as those conducted with a heat resistor or a thermocouple can be adopted to detect the temperature of the each area of the battery surface. Adopting the heat resistor or thermocouple related temperature detection technology makes it easier to achieve integration, thereby making it convenient to achieve temperature detection in a small device or a portable device.

In one implementation, the temperature sensing sensor comprises temperature sensing probes disposed corresponding to the each area. For example, the battery surface can be divided into multiple areas, each area is provided with a temperature sensing probe, and temperature of the each area is detected in real time through the temperature sensing probe. That is to say, in an implementation, the temperature of each area is acquired through a temperature sensing probe disposed corresponding to the each area.

In an implementation, as illustrated in FIG. 3, the multiple areas are arranged in array. For example, Area 1 to Area 9 are in a 3*3 array.

In another implementation, in order to reduce complexity of a temperature detecting scheme, the temperature sensing probe can also be disposed only in areas of the battery that are easy to be damaged, such as a corner area of the battery, a head area of the battery, and a tail area of the battery, as illustrated in FIG. 4. In other words, the multiple areas can include a corner area of the battery, a head area of the battery, and a tail area of the battery.

The differential amplifying circuit applied to detect in real time the voltage of the battery is illustrated in FIG. 5. The differential amplifying circuit, as illustrated in FIG. 5, can include a resistor R1, a resistor R2, a capacitor C1, and a differential amplifier X1. The resistor R2 has one end coupled with a positive electrode of the battery and the other end coupled with a negative input end of the differential amplifier. The resistor R1 and the capacitor C1 form an RC voltage-stabilizing and filtering circuit. The resistor R1 has one end coupled with the negative input end of the differential amplifier X1 and the other end grounded. The capacitor C1 is coupled in parallel with the resistor R1. The differential amplifier X1 has a positive input end also coupled with the positive electrode of the battery. Real-time detection of the voltage of the battery can be achieved through the differential amplifying circuit, and whether a sudden change has occurred to the voltage of the battery can be determined according to a signal output by the differential amplifying circuit.

It can be understood that, the negative input end of the differential amplifier X1 is grounded via the capacitor C1. When the sudden change in voltage has occurred to the battery, due to the capacitor, a voltage of the negative input end of the differential amplifier X1 will remain unchanged within a certain time period, while a voltage of the positive input end of the differential amplifier X1 will suddenly change directly, and output of the differential amplifier X1 will be inverted, therefore, it is possible to determine whether the sudden change in voltage has occurred to the battery by monitoring an output signal of the differential amplifier X1.

It should be noted that, in other implementations of the present disclosure, the voltage of the battery can also be detected in real time through other voltage detecting circuits, to achieve real-time detection of the voltage of the battery. The circuit for detecting the voltage of the battery can be implemented in various manners, which is known to those skilled in the art and will not be described in detail herein.

In one implementation, the determining module 120 is configured to determine whether the battery surface has the abnormal temperature area by determining whether there is an area of which a temperature is higher than temperatures of other areas, or by determining whether there is an area of which a temperature is higher than a preset temperature threshold. For example, when an area is detected to have a temperature higher than temperatures of other areas, the area can be regarded as the abnormal temperature area, in other words, the battery surface has the abnormal temperature area.

By comparing the temperature of each area, interference of outside temperature with detection results can also be avoided, thereby improving detection accuracy.

In one implementation, the safety monitoring module 130 is configured to determine that the battery is currently abnormal upon determining, by the determining module, that the sudden change in voltage has occurred to the battery and the battery surface has the abnormal temperature area, when the battery is in a no-load state or a light-load state.

The "no-load state" means that the battery is currently not discharged and there is no battery consumption current, for instance, the terminal device is in a power-off state. The "light-load state" means that present consumption current of the battery is very small, such as approximately 5 mA to 6 mA, for instance, the terminal device is in a screen-off state or in a light-system-load state.

When the battery is in the no-load state or in the light-load state, whether the sudden change in voltage has occurred to the battery and whether the battery surface has the abnormal temperature area are detected, which can get rid off interference of an instant drop in voltage and an increase in temperature of the battery surface due to a sudden change in system load, thereby improving detection accuracy.

In one implementation, the determining module 120 is further configured to determine whether an instant drop in voltage has occurred to the battery according to the voltage of the battery acquired in real time, and determine that the sudden change in voltage has occurred to the battery when the instant drop in voltage has occurred to the battery.

The determining module 120 is configured to determine that the instant drop in voltage has occurred to the battery, when a magnitude of decrease in the voltage of the battery within a preset time period is greater than or equal to a preset threshold.

Specifically, as an implementation, when the battery is in a no-load state or a light-load state, the preset threshold is greater than or equal to 10 mV, such as 150 mV to 400 mV.

Specifically, in one implementation, voltage monitoring curves in a process in which the battery is subject to damage are illustrated in FIG. 6. Curve 1 is a voltage curve of a slightly damaged battery. Curve 2 is a voltage curve of a seriously damaged battery. Curve 3 a voltage curve of a normal battery that not damaged at all. According to Curve 1, when the battery is slightly damaged, the voltage of the battery changes suddenly from 3.8V to 3.63V in an instant and then is restored to about 3.8V. According to Curve 2, when the battery is seriously damaged, the voltage of the battery changes suddenly from 3.8V to 3.51V in an instant and then is restored to nearly 3.8V. According to Curve 3, for a normal battery, which is not damaged, the voltage of the battery remains nearly 3.8V. Therefore, by comparison of Curve 1, Curve 2, and Curve 3, once the battery is subject to an external mechanical damage such as dropping, colliding, squeezing, piercing, and the like, there will be a sudden change in the voltage of the battery, that is, the voltage will drop instantly. In addition, different degrees to which the battery is damaged result in different magnitudes of drops in the voltage.

Therefore, with aid of the system for monitoring battery safety of a terminal device provided herein, whether the battery is currently abnormal is determined by detecting whether the sudden change has occurred to the voltage the battery and detecting whether the battery surface has the abnormal temperature area. As such, real-time monitoring can be achieved upon battery damage, and prompt alert and repair can be made, which avoids potential safety hazard brought about by battery abnormality and improves considerably safety of the terminal device in use.

In one implementation, the safety monitoring module 130 is further configured to mark the battery as abnormal upon determining that the battery is currently abnormal, and control the terminal device to send alert information indicative of battery abnormality when the terminal device is in a power-on state.

For example, when the battery is detected to be currently abnormal, it is necessary to remind a user. As an implementation, as illustrated in FIG. 7, the user can be reminded by such alert information as "Battery safety notification: dear customer, your battery is abnormal due to damage at present. For your safety, please get your terminal device inspected and repaired at xxx branch of service. Thank you". As another implementation, when the user is reminded through the alert information illustrated in FIG. 7, the user can be further reminded by an indicator light flashing. For example, control the indicator light to flash in red light at a high frequency. As yet another implementation, the user can be further reminded through a speech function of the terminal device.

In general, when the user receives the above alert information, the user can promptly get the terminal device inspected and repaired. However, some users may fail to realize the seriousness of the problem when they receive the alert information. Therefore, they are likely to ignore the alert information and continue using the terminal device as usual. In this case, the user can be reminded multiple times. For example, the user can be reminded at least three times. When the user still does not deal with the problem after being reminded multiple times, some functions of the terminal device can be restricted.

In one implementation, the safety monitoring module 130 can be further configured to determine a fault grade of the battery according to the sudden charge in voltage that has occurred to the battery and temperature information of the abnormal temperature area, and restrict corresponding functions of the terminal device according to the fault grade determined, when the battery is currently abnormal.

That is to say, the safety monitoring module 130 can be configured to determine the fault grade according to a magnitude of an instant drop in the voltage of the battery and the temperature information of the abnormal temperature area. For example, a greater magnitude of the instant drop in the voltage of the battery and a higher temperature of the abnormal temperature area indicate more serious battery damage. Accordingly, battery damage can include average damage, relatively serious damage, serious damage, and battery failure according to an extent to which the battery is damaged. Corresponding fault grades can be determined as an average grade, a relatively serious grade, a serious grade, and a complete fault grade. In turn, corresponding functions of the terminal device can be restricted according to the fault grade.

For instance, generally speaking, lower power consumption of applications of the terminal device leads to lower heating when the battery is in use. Exemplarily, only an instant messaging (IM) application is launched without a video chat. In this case, power consumption is low, heating of the battery is low, and thus risks of the battery are less likely to occur. However, when power consumption of an application(s) is high, such as watching a video, playing a mobile game, etc., power consumption of the battery is high and heating of the battery is high, which can easily cause accidents. Therefore, when the battery is determined to be abnormal, the safety monitoring module 130 is configured to forbid use of applications of high power consumption such as video applications, game applications, etc. in case that the fault grade is the average grade. The safety monitoring module 130 is configured to forbid directly the entire system to be launched for fear of accidents, and alert information such as "there is potential safety hazard in the battery and the system is forbidden to be launched. Please get the terminal device inspected and repaired at xxx branch of service. Thank you for your cooperation" is displayed on the display screen of the terminal device to remind the user in case that the fault grade is the relatively serious grade or the serious grade; battery failure occurs and the system is powered off and unable to be launched in case that the fault grade is the complete fault grade.

In addition, since heating can also occur in a charging process of the battery, especially in a quick charging state where more heating occurs within a short time, the safety monitoring module 130 is further configured to forbid quick charging of the battery when the battery is determined to be abnormal. In a more serious situation, the user is even forbidden to charge the battery for fear of accidents, and alert information such as "due to battery damage, charging of the battery is forbidden. Please get the terminal device inspected and repaired at xxx branch of service. Thank you for your cooperation" is displayed on the display screen of the terminal device to remind the user.

In implementations of the present disclosure, the safety monitoring module 130 can be a battery manager with a battery management function, a battery protection system with a battery protection function, or a terminal-device control system which integrates the battery management function, the battery protection function, and terminal device control function, which is not limited herein.

With aid of the system for monitoring battery safety of a terminal device, the first acquiring module is configured to acquire in real time the voltage of the battery, and the temperature acquiring module is configured to acquire in real time the temperature of each area of the battery surface. Then the determining module is configured to determine whether the sudden change in voltage has occurred to the battery according to the voltage of the battery acquired in real time, and determine whether the battery surface has the abnormal temperature area according to the temperature of each area. Finally, the safety monitoring module is configured to determine that the battery is currently abnormal when the sudden change in voltage has occurred to the battery and the battery surface has the abnormal temperature area. In other words, when the battery is currently damaged, a sudden change will occur to the voltage of the battery, and meanwhile heating will occur in an area where an internal short circuit is caused by battery damage. In implementations of the disclosure, whether the battery is currently abnormal is determined by detecting whether the sudden change has occurred to the voltage the battery and whether the battery surface has the abnormal temperature area. In this way, real-time monitoring can be achieved upon battery damage, and prompt alert and repair can be made to avoid potential safety hazard caused by battery abnormality, which can substantially improve safety of the terminal device in use.

Figure 9:
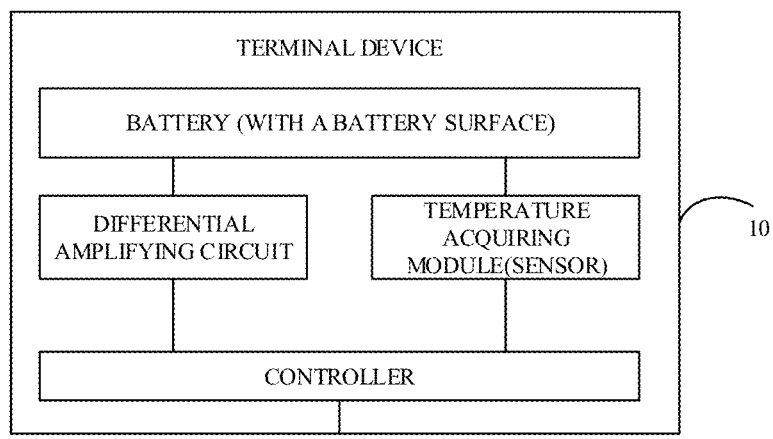
FIG. 9 is a schematic block diagram illustrating a terminal device according to an implementation of the present disclosure.

In addition, as illustrated in FIG. 9, a terminal device 10 is also provided in implementations of the disclosure. The terminal device 10 includes a battery and the system 100 for monitoring battery safety of a terminal device described above. The battery has a battery surface which can be divided into multiple areas. The system 100 can include: a differential amplifying circuit and a temperature acquiring module such as a temperature sensor coupled with the battery respectively, and a controller coupled with the differential amplifying circuit and the temperature acquiring module. The differential amplifying circuit is configured to acquire in real time a voltage of the battery. The temperature acquiring module is configured to acquire in real time temperature of each area of the battery surface. The controller is configured to determine whether the battery is abnormal according to the detection result of the differential amplifying circuit and the temperature acquiring module. For example, the controller determines whether a sudden change in voltage has occurred to the battery according to the voltage of the battery acquired in real time by the differential amplifying circuit, and determines whether the battery surface has an abnormal temperature area according to the temperature of each area acquired by the temperature acquiring module, and determines that the battery is currently abnormal, upon determining that the sudden change in voltage has occurred to the battery and the battery surface has the abnormal temperature area. For details, reference can be made to the above description and will not be repeated herein.

According to the terminal device provided herein, with aid of the system for monitoring battery safety of a terminal device described above, whether a battery is currently abnormal is determined by monitoring whether a sudden change in voltage has occurred to the battery and whether a battery surface has an abnormal temperature area. In this way, real-time monitoring can be achieved upon battery damage, and prompt alert and repair can be made to avoid potential safety hazard caused by battery abnormality, which can substantially improve safety of the terminal device in use.

It should be understood that terms such as "center", "longitudinal", "lateral", "length", "width", "thickness", "on", "under", "front", "back", "left", "right", "vertical", "horizontal", "top", "bottom", "in", "out", "clockwise", "anticlockwise", "axial", "radial", "circumferential", and the like referred to herein which indicate directional relationship or positional relationship are directional relationship or positional relationship based on accompanying drawings and are only for the convenience of description and simplicity, rather than explicitly or implicitly indicate that apparatuses or components referred to herein must have a certain direction or be configured or operated in a certain direction and therefore cannot be understood as limitation on the disclosure.

In addition, terms "first", "second", and the like are only used for description and cannot be understood as explicitly or implicitly indicating relative importance or implicitly indicating the number of technical features referred to herein. Therefore, features restricted by terms "first", "second", and the like can explicitly or implicitly include at least one of the features. In the context of the disclosure, unless stated otherwise, "multiple" refers to "at least two", such as two, three, and the like.

Unless stated otherwise, terms "installing", "coupling", "connecting", "fixing", and the like referred to herein should be understood in broader sense. For example, coupling may be a fixed coupling, a removable coupling, or an integrated coupling, may be a mechanical coupling, an electrical coupling, and may be a direct coupling, an indirect coupling through a medium, or a communication coupling between two components or an interaction coupling between two components. For those of ordinary skill in the art, the above terms in the present disclosure can be understood according to specific situations.

Unless stated otherwise, a first feature being "on" or "under" a second feature referred to herein can refer to a direct contact between the first feature and the second feature or an indirect contact between the first feature and the second feature via a medium. In addition, the first feature being "above", "over", and "on" the second feature can be the first feature being right above or obliquely above the second feature or only refers to the first feature being at higher horizontal level than the second feature. The first feature being "below", "underneath", and "under" the second feature can be the first feature being right below or obliquely below the second feature or only refers to the first feature being at lower horizontal level than the second feature.

The reference term "an embodiment", "some embodiments", "implementation", "specific implementation", or "some implementations" referred to herein means that a particular feature, structure, material, or characteristic described in conjunction with the embodiment or implementation may be contained in at least one embodiment or implementation of the present disclosure. The phrase appearing in various places in the specification does not necessarily refer to the same embodiment or implementation. The particular feature, structure, material, or characteristic described may be properly combined in any one or more embodiments or implementations. In addition, when the embodiment or implementation is not mutually exclusive with other embodiments or implementations, it is expressly and implicitly understood by those skilled in the art that an embodiment described herein may be combined with other embodiments or implementations.

Those of ordinary skill in the art will appreciate that units (including sub-units) and algorithmic operations of various examples described in connection with implementations herein can be implemented by electronic hardware or by a combination of computer software and electronic hardware. Whether these functions are performed by means of hardware or software depends on the application and the design constraints of the associated technical solution. A professional technician may use different methods with regard to each particular application to implement the described functionality, but such methods should not be regarded as lying beyond the scope of the disclosure.

It will be evident to those skilled in the art that the corresponding processes of the above method implementations can be referred to for the working processes of the foregoing systems, apparatuses, and units, for purposes of convenience and simplicity and will not be repeated herein.

It will be appreciated that the systems, apparatuses, and methods disclosed in implementations herein may also be implemented in various other manners. For example, the above apparatus implementations are merely illustrative, e.g., the division of units (including sub-units) is only a division of logical functions, and there may exist other ways of division in practice, e.g., multiple units (including sub-units) or components may be combined or may be integrated into another system, or some features may be ignored or not included. In other respects, the coupling or direct coupling or communication connection as illustrated or discussed may be an indirect coupling or communication connection through some interface, device or unit, and may be electrical, mechanical, or otherwise.

Separated units (including sub-units) as illustrated may or may not be physically separated. Components or parts displayed as units (including sub-units) may or may not be physical units, and may reside at one location or may be distributed to multiple networked units. Some or all of the units (including sub-units) may be selectively adopted according to practical needs to achieve desired objectives of the disclosure.

Additionally, various functional units (including sub-units) described in implementations herein may be integrated into one processing unit or may be present as a number of physically separated units, and two or more units may be integrated into one.

If the integrated units are implemented as software functional units and sold or used as standalone products, they may be stored in a computer readable storage medium. Based on such an understanding, the essential technical solution, or the portion that contributes to the prior art, or all or part of the technical solution of the disclosure may be embodied as software products. Computer software products can be stored in a storage medium and may include multiple instructions that, when executed, can cause a computing device, e.g., a personal computer, a server, a second adapter, a network device, etc., to execute some or all operations of the methods as described in the various implementations. The above storage medium may include various kinds of media that can store program code, such as a USB flash disk, a mobile hard drive, a read-only memory (ROM), a random access memory (RAM), a magnetic disk, or an optical disk.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for monitoring battery safety of a terminal device, comprising:
    acquiring in real time a voltage of a battery of the terminal device, and acquiring in real time temperature of each area of a battery surface of the battery, wherein the battery surface is divided into a plurality of areas;
    determining whether a sudden change in voltage has occurred to the battery according to the voltage of the battery acquired in real time, and determining whether the battery surface has an abnormal temperature area according to the temperature of each area, wherein the sudden change in voltage is determined to be occurred when a magnitude of decrease in the voltage of the battery within a preset time period is greater than or equal to a preset threshold, an area is determined to be an abnormal temperature area when the temperature of the area is higher than threshold temperature; and
    determining that the battery has an internal short circuit, upon determining that the sudden change in voltage has occurred to the battery and the battery surface has the abnormal temperature area.

2. The method of claim 1, further comprising:
    marking the battery as abnormal upon determining that the battery has an internal short circuit; and
    controlling the terminal device to send alert information indicative of battery abnormality when the terminal device is in a power-on state.

3. The method of claim 1, wherein the temperature of each area is acquired through a temperature sensing probe disposed corresponding to the each area.

4. The method of claim 1, wherein the plurality of areas is arranged in array.

5. The method of claim 1, wherein the plurality of areas comprises a corner area of the battery, a head area of the battery, and a tail area of the battery.

6. The method of claim 1, further comprising:
    determining a fault grade of the battery according to the sudden charge in voltage that has occurred to the battery and temperature information of the abnormal temperature area; and
    restricting corresponding functions of the terminal device according to the fault grade, upon determining that the battery is currently abnormal.

7. A system for monitoring battery safety of a terminal device, comprising:
    a differential amplifying circuit, configured to acquire in real time a voltage of a battery of the terminal device;
    a temperature acquiring module, configured to acquire in real time temperature of each area of a battery surface of the battery, wherein the battery surface is divided into a plurality of areas; and
    a controller, configured to:
        determine whether a sudden change in voltage has occurred to the battery according to the voltage of the battery acquired in real time, wherein the sudden change in voltage is determined to be occurred when a magnitude of decrease in the voltage of the battery within a preset time period is greater than or equal to a preset threshold;

determine whether the battery surface has an abnormal temperature area according to the temperature of each area, wherein an area is determined to be an abnormal temperature area when the temperature of the area is higher than threshold temperature; and determine that the battery has an internal short circuit, upon determining that the sudden change in voltage has occurred to the battery and the battery surface has the abnormal temperature area.

8. The system of claim 7, wherein the controller is further configured to:

mark the battery as abnormal upon determining that the battery has an internal short circuit; and control the terminal device to send alert information indicative of battery abnormality when the terminal device is in a power-on state.

9. The system of claim 7, wherein the temperature sensing sensor comprises temperature sensing probes disposed corresponding to the each area.

10. The system of claim 7, wherein the plurality of areas is arranged in array.

11. The system of claim 7, wherein the plurality of areas comprises a corner area of the battery, a head area of the battery, and a tail area of the battery.

12. The system of claim 7, wherein the differential amplifying circuit comprises:

a differential amplifier Xl, having a positive input end coupled with a positive electrode of the battery;

a resistor R1, having one end coupled with a negative input end of the differential amplifier X1 and the other end grounded;

a resistor R2, having one end coupled with the positive electrode of the battery and the other end coupled with the negative input end of the differential amplifier; and a capacitor C1, coupled in parallel with the resistor R1.

13. A terminal device, comprising:

a battery having a battery surface divided into a plurality of areas;

a differential amplifying circuit, configured to acquire in real time a voltage of the battery;

a temperature acquiring module, configured to acquire in real time temperature of each area of the battery surface; and a controller, configured to:

determine whether a sudden change in voltage has occurred to the battery according to the voltage of the battery acquired in real time, wherein the sudden change in voltage is determined to be occurred when a magnitude of decrease in the voltage of the battery within a preset time period is greater than or equal to a preset threshold;

determine whether the battery surface has an abnormal temperature area according to the temperature of each area, wherein an area is determined to be an abnormal temperature area when the temperature of the area is higher than threshold temperature; and determine that the battery has an internal short circuit, upon determining that the sudden change in voltage has occurred to the battery and the battery surface has the abnormal temperature area.

14. The terminal device of claim 13, wherein the differential amplifying circuit comprises:

a differential amplifier Xl, having a positive input end coupled with a positive electrode of the battery;

a resistor R1, having one end coupled with a negative input end of the differential amplifier X1 and the other end grounded;

a resistor R2, having one end coupled with the positive electrode of the battery and the other end coupled with the negative input end of the differential amplifier; and a capacitor C1, coupled in parallel with the resistor R1.

* * * * *